Figure 1:
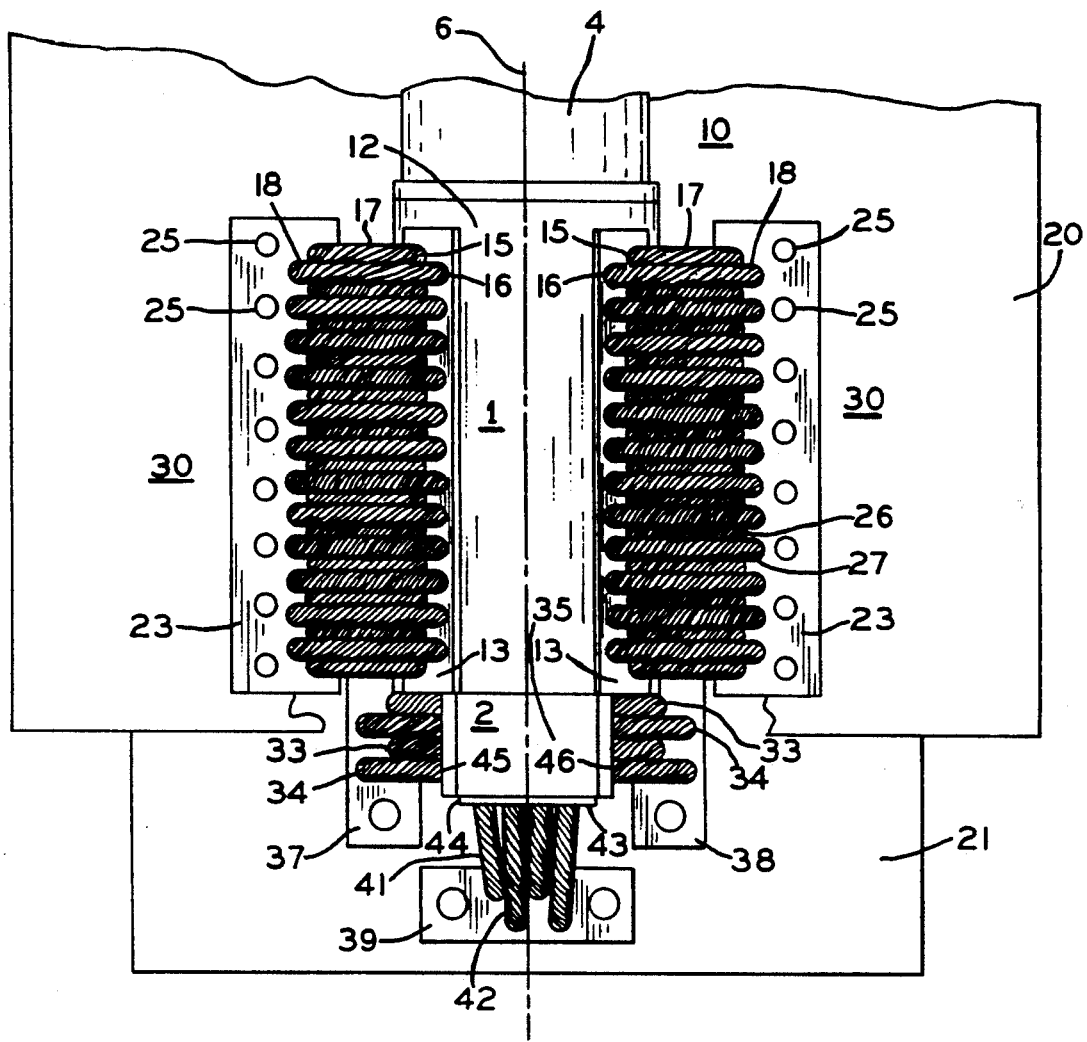

United States Patent
Goldberg et al.

[11] Patent Number: 5,317,879
[45] Date of Patent: Jun. 7, 1994

[54] FLEXIBLE THERMAL CONNECTION SYSTEM BETWEEN A CRYOGENIC REFRIGERATOR AND AN MRI SUPERCONDUCTING MAGNET

[75] Inventors: Charles Goldberg; Steven D. Schnurer; John Scaturro, Jr.; Kemakolam M. Obasih; Clifford J. Ginfrida, Jr., all of Florence, S.C.

[73] Assignee: General Electric Company, Milwaukee, Wis.

[21] Appl. No.: 967,312

[22] Filed: Oct. 28, 1992

[51] Int. Cl.$^5$ .................... F25B 19/00; F25D 19/00
[52] U.S. Cl. .......................... 62/51.1; 62/295; 62/383; 165/185; 505/888
[58] Field of Search .................. 62/51.1, 295, 383; 505/888; 165/185

[56] References Cited

U.S. PATENT DOCUMENTS

| 4,161,747 | 7/1979 | Jennings | 165/185 X |
| 4,394,819 | 7/1983 | Averill | 62/295 X |
| 4,745,761 | 5/1988 | Bazaj et al. | 62/295 X |
| 4,777,807 | 10/1988 | White | 62/295 X |
| 4,869,068 | 9/1989 | Van Vloten | 62/51.1 |
| 4,926,647 | 5/1990 | Dorri et al. | 62/51.1 |
| 4,930,318 | 6/1990 | Brzozowski | 62/295 X |
| 4,986,078 | 1/1991 | Laskaris | 62/51.1 |
| 5,018,359 | 5/1991 | Horikawa et al. | 62/51.1 |
| 5,077,637 | 12/1991 | Martorana et al. | 165/185 X |
| 5,129,232 | 7/1992 | Minas et al. | 62/295 X |

FOREIGN PATENT DOCUMENTS 2242079 9/1990 Japan ...................... 62/295

Primary Examiner—Henry A. Bennet
Assistant Examiner—Christopher B. Kilner
Attorney, Agent, or Firm—Irving M. Freedman; James O. Skarsten

[57] ABSTRACT

A flexible heat transfer assembly between a cryogenic refrigerator cold head sleeve and magnetic resonance imager thermal shields includes a plurality of rope-lay stranded copper ropes, each containing a large number of section.

14 Claims, 1 Drawing Sheet

FLEXIBLE THERMAL CONNECTION SYSTEM BETWEEN A CRYOGENIC REFRIGERATOR AND AN MRI SUPERCONDUCTING MAGNET

BACKGROUND OF INVENTION

This invention relates to a flexible thermal connection between a cryogenic refrigerator and a magnetic resonance imager (hereinafter "MRI") superconducting magnet.

As is well known, a magnet coil can be made superconducting by placing it in an extremely cold environment, such as by enclosing it in a cryostat or pressure vessel containing liquid helium or other cryogen. The extreme cold reduces the resistance of the magnet coil to negligible levels, such that when a power source is initially connected to the coil (for a period, for example, of 10 minutes) to introduce a current flow through the coil, the current will continue to flow through the coil due to the negligible coil resistance even after power is removed, thereby maintaining a magnetic field. Superconducting magnets find wide application, for example, in the field of MRI.

In a typical MRI, the pressure vessel, which is contained within a vacuum vessel, is surrounded by a plurality of concentric heat shields. Each successive heat shield is at a slightly higher temperature than the cryogen in order to thermally isolate the pressure vessel from ambient temperatures on the outside of the vacuum vessel, which may be in the order of some 300° C. higher than the cryogen temperature. The thermal shields are maintained at their cold temperatures by a cryogenic refrigerator which typically is contained within a stainless steel cold head sleeve cylinder with thermal connections between the cold head and the thermal shields. The thermal connection between the cold head and the thermal shields must be thermally conductive and efficient, and operate in the presence of vibration generated by the movement of the piston within the cryogenic refrigerator and the resultant movement of the cold head relative to the heat shields. In addition, the thermal connection must withstand the wide change in temperatures to which the assembly is subjected in cooling the superconducting magnet from ambient temperature to a temperature in the range of absolute zero (−270° C.), and also must withstand, yet not affect, the strong magnetic fields present within the MRI, and the requirement of magnetic field homogeneity. Still further, the thermal connection must also withstand the thermal and mechanical forces resulting from differential expansion of materials during cool-down.

Flexible connections such as flat, braided cable have not proven to be completely satisfactory in meeting all of these overlapping and/or conflicting requirements.

Accordingly, it is highly desirable to be able to provide a flexible thermal connection between the cryogenic refrigerator and the thermal shields and/or the magnetic cartridge of a superconducting MRI magnet which operates in such a harsh environment yet which minimizes the transmission of motion and vibration to the heat shields in order to minimize the effects of the cryogenic refrigerator operating mechanism on magnetic field homogeneity and the resultant image quality of the MRI system.

OBJECTS AND SUMMARY OF INVENTION

It is an object of the present invention to provide an improved apparatus to thermally interconnect a cryogenic refrigerator in an MRI to the superconducting magnet.

It is another object of the present invention to provide an improved apparatus to thermally interconnect a cryogenic refrigerator in an MRI to the superconducting magnet in which the interconnect is flexible and minimizes the transmission of motion and vibration to the superconducting magnet or thermal shields.

It is yet another object of the present invention to provide an improved apparatus to thermally interconnect a cryogenic refrigerator in an MRI to the superconducting magnet which can withstand the environment and forces encountered during cool-down and operation of the MRI, including thermal, mechanical and magnetic forces.

In accordance with one form of the invention, a cryogenic refrigerator is positioned within a cryogenic refrigerator cold head sleeve and a plurality of flexible thermal connections extend between the cold head sleeve and the thermal shields of the MRI. The flexible thermal connections include a plurality of copper wires braided into a rope-lay stranded cable of circular cross section. Copper blocks provide thermal interfaces at the heat shields, and the rope-lay stranded cable includes in excess of 1,500 individual copper wires.

The stainless steel refrigerator cold head sleeve is cylindrical in cross section and surrounds a multiple-stage refrigerator with separate axial regions of the cold head sleeve Contiguous to each refrigerator stage. Multiple thermal ropes extend between each stage and an adjacent thermal shield. Copper contact strips extend axially along the cold head sleeve for thermally connecting the ropes to the cold head.

BRIEF DESCRIPTION OF INVENTION

Figure 2:
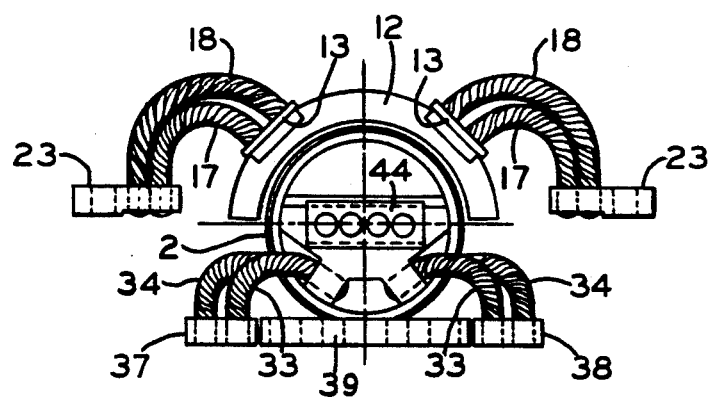

FIG. 1 is a top view showing the present invention.
FIG. 2 is a front view of FIG. 1.

Referring to FIGS. and 2, the stainless steel refrigerator cold head sleeve 10 is substantially circular in cross section, including a first stage region indicated generally as 1 extending about axis 6 and a second stage region indicated generally as 2. A cryogenic refrigerator 4, such as a two-stage Gifford-McMahon refrigerator, model LGYBOLD RGD-580, is positioned within stainless steel refrigerator cold head sleeve 10 for cryogenic cooling by the first stage of the cryogenic refrigerator of adjacent first stage region 1, and cryogenic cooling by the second stage of the cryogenic refrigerator of adjacent second stage region 2 of the refrigerator cold head sleeve. Cryogenic refrigerator 4 conventionally includes a moving piston which moves axially along axis 6 of refrigerator cold head sleeve 10 to periodically compress the coolant within the refrigerator in a conventional cooling cycle well known in the art. It is to be noted that the first stage region 1 of refrigerator cold head sleeve 10 is of a larger diameter than the second stage region 2 of the cold head sleeve, such that the temperature generated by cryogenic refrigerator 4 is in the order of eighty degrees Kelvin (80K) for the first stage region and twenty degrees Kelvin (20K) for the second stage region.

Half-moon shaped copper heat station 12 conforms to the outer surface of refrigerator cold head sleeve 10 in intimate contact with first stage region of the refrigerator cold head sleeve, to which it is suitably fastened such as by brazing. A pair of copper contact strips 13 include a plurality of apertures, such as 15 and 16, into which flexible thermal connections or ropes, such as 17 and 18, are inserted and welded. Ropes such as 17 and 18 are extra flexible rope-lay stranded copper cables or ropes manufactured by New England Electric Wire Corporation of Lisbon, New Hampshire, under their part number NER773436B, and utilizing 1,666 copper wires of American Wire Gauge (AWG) size 36 braided into a circular rope of 0.299 inches nominal diameter (AWG size 4). Its construction is described as 7×7×34/36. That is, there are 7 strands which are braided into a rope-lay cable or rope with each strand comprising 238 individual copper wires braided from strands formed of 7 groups of 34 wires each. As a result, the 7 strands, each comprising 238 wires, total 1,666 individual copper wires. The term "36" in the construction 7×7×34/36 designates the AWG size of the individual copper wires. Ropes such as 17 and 18 extend between copper contact strips 13 positioned on first stage region 1 and copper interface bars 23 which are secured by a plurality of bolts such as 25 to 80K thermal shield 2 of the superconducting magnet. Flexible ropes 17 and 18 are positioned within apertures or holes such as 15 and 16 in copper contact strips 13 and similar apertures 26 and 27 in copper interface bars 23; after which, the ropes are welded in place to their associated contact strip 13 and interface bar 23. Holes 15 are positioned on contact strip 13 closer to interface bar 23 than holes 16, such that alternating ropes 17 and 18 are of different lengths.

Flexible heat transfer assemblies 30 thus include a plurality of flexible ropes such as 17 and 18 extending between copper contact strips 13 and copper interface buses 23 which may be manufactured as a subassembly which subsequently can be positioned between copper heat station 12 of first stage region 1 and 80K thermal shield 20. Copper contact strips 13 may be secured to half moon shaped copper heat station 12 in a suitable manner such as by welding and, upon installation, copper interface bus 23 may be bolted by bolts 25 to thermal shield 20.

Second stage region 2 of refrigerator cold head sleeve 10 includes a plurality of flexible ropes 33 and 34 extending between heat sink 35, which surrounds second stage region 2 of cold head sleeve 10, and a plurality of copper interface bars 37, 38 and 39. It is to be noted that rope braids such as 33 and 34, which are alternately of different lengths as in flexible heat transfer assemblies 30, extend radially outward from axis 6, while a plurality of additional flexible ropes 41 and 42 (four in number) extend axially outwardly from the closed end 43 of second stage region 2 of refrigerator cold head sleeve 10, and are secured to second stage region 2 by copper interface 44 at closed end 43. Flexible ropes 33, 34, 41 and 42 are welded into holes in their respective interface bars 37, 38 and 39 and interfaces 44, 45 and 46, respectively, in the manner described above regarding ropes 17 and 18 of first stage region 1.

Flexible thermal connecting ropes such as 17, 18, 33, 34, 41 and 42 allow adequate heat transfer between the cryogenic magnet of the MRI to cooled regions such as thermal shields 20 and 21, and significantly reduce the vibration by cryogenic refrigerator 4 within refrigerator cold head sleeve 10 from reaching superconducting magnet thermal shields 20 and 21 which surround the superconducting magnet coil assembly (not shown). This stabilizes thermal shields 20 and 21 since vibration of the heat shields will adversely affect the homogeneity of the strong magnetic field of the MRI and image quality. In addition, flexible ropes 17, 18, 33, 34, 41 and 42 allow for differential thermal contraction because of their flexibility and length. It was found that the linear stiffness of the copper rope braids of the present invention was approximately 25 pounds per inch, indicating that the motion and vibration generated by cryogenic refrigerator 4 and transferred to thermal shields 20 and 21 was in the order of 1/12 of that resulting from other flexible connections measured, including flat, braided copper cable. A major advantage of the invention is the resultant improvement in the image quality of the MRI system. In an MRI system utilizing a 1.5 Tesla active shield magnet arrangement, the present invention resulted in a seven-fold improvement in image quality. Substantial image quality improvement was also exhibited by MRIs in the range of 0.5 Tesla.

It is to be noted that there are thirteen of the shorter length ropes 17 and 12 longer length ropes 18 in flexible heat transfer assemblies 30 associated with first stage region 1 of refrigerator cold head sleeve 10. Second stage region 2 utilizes alternating pairs of short ropes 33 and long ropes 34 extending in the radial direction, and two pairs of alternating short ropes 41 and long ropes 42 extending in the axial direction of the second stage. In a typical installation, the length of ropes 17 is in the order of 4.00 inches, the length of ropes 18 is 4.50 inches, the length of ropes 33 is 2.75 inches, the length of ropes 34 is 3.00 inches, the length of ropes 41 is 2.75 inches, and the length of ropes 42 is 3.00 inches. After rope braids 17, 18; 33, 34; and 41, 42 are welded in place between contact strips and interface bars 13, 23; 45, 37 and 46, 38; and 44, 39, respectively, with radii in the order of inch for rope braids 17, 18; 0.63 inches for rope braids 33, 34; and 0.63 inches for rope braids 41, 42.

The subject invention has thus proven to produce flexible heat transfer assemblies exhibiting desired thermal, magnetic and mechanical characteristics required for use in superconducting magnets for MRI equipment. While the present invention has been described with respect to certain preferred embodiments thereof, it is to be understood that numerous variations in details of construction, the arrangement and combination of parts, and the type of materials used may be made without departing from the spirit and scope of the invention.

What we claim is:

1. A heat transfer assembly for a superconducting magnet assembly including a superconducting magnet coil and capable of resisting shock and vibration and utilizing conduction cooling comprising:
   a cryogenic refrigerator positioned in heat exchange relationship with a superconducting magnet;
   at least one thermal member thermally shielding said superconducting magnet coil;
   a cryogenic refrigerator cold head sleeve surrounding said cryogenic refrigerator proximate to said thermal member;
   a plurality of thermal interfaces in contact with said at least one thermal member;
   a plurality of flexible thermal connections extending between said cold head sleeve and each said at least one thermal member;
   said flexible thermal connections comprising a substantially circular cross section flexible rope-lay stranded cable including a plurality of thermally conductive strands, each strand of which include a plurality of wires.

2. The superconducting magnet heat transfer assembly of claim 1 wherein said thermally conductive wires are copper; and each said rope-lay stranded cable forms an arc of approximately ninety degrees in extending between said cold head sleeve and said at least one thermal member.

3. The superconducting magnet heat transfer assembly of claim 2 wherein said rope-lay stranded cable includes in excess of 1,500 copper wires.

4. The superconducting magnet heat transfer assembly of claim 3 wherein said refrigerator cold head sleeve is stainless steel.

5. The superconducting magnet heat transfer assembly of claim 4 wherein :
said cold head sleeve is cylindrical in cross section about the axis of the refrigerator;
said at least one thermal member includes multiple thermal shields;
said cryogenic refrigerator is a multiple stage refrigerator wherein separate regions of said cold head sleeve are contiguous to each stage of said cryogenic refrigerator; and
a plurality of the rope cables extend between each said region of said cold head sleeve to an adjacent thermal shield.

6. The superconducting magnet heat transfer assembly of claim 5 wherein:
said refrigerator is positioned within said cold head sleeve;
said multiple stage refrigerator provides said cold head sleeve first stage region and second stage region at different temperatures; and
said rope cables extending from said second stage to a thermal shield extend in both the radial and axial directions about the axis of said cold head sleeve.

7. The superconducting magnet heat transfer assembly of claim 6 wherein the at least one rope cable extending from said first stage is welded at the opposite end to a copper thermal contact strip on said stainless steel cold sleeve of said first stage.

8. The superconducting magnet heat transfer assembly of claim 7 wherein the diameter of the second stage cold head sleeve is less than the diameter of said first stage cold head sleeve.

9. A heat transfer assembly for a superconducting magnet assembly including a superconducting magnet coil and at least one thermal shield capable of resisting shock and vibration and utilizing conduction cooling comprising:
a cryogenic refrigerator positioned in heat exchange relationship with a superconducting magnet;
at least one thermal shield member thermally shielding said superconducting magnet coil;
a cryogenic refrigerator cold head sleeve surrounding said cryogenic refrigerator proximate to said thermal member;
a plurality of thermal interfaces in contact with said at least one thermal shield member;
a plurality of flexible thermal connections extending between said cold head sleeve and each said at least one thermal shield member;
said flexible thermal connections comprising a substantially circular cross section flexible rope-lay stranded cable including a plurality of thermally conductive strands, each of which include a plurality of wires;
wherein said thermally conductive wires are copper;
said rope includes in excess of 1,500 copper wires;
said thermal interfaces are copper blocks secured to said at least one thermal member;
said copper blocks are bolted to said at least one thermal member;
said refrigerator cold head sleeve is stainless steel;
said cold head sleeve is cylindrical in cross section about the axis of the refrigerator;
said at least one thermal member includes multiple thermal shields;
said cryogenic refrigerator is a multiple stage refrigerator wherein separate regions of said cold head sleeve are contiguous to each stage of said cryogenic refrigerator;
a plurality of the rope cables extend between each said region of said cold head sleeve to an adjacent thermal shield;
said refrigerator is positioned within said cold head sleeve;
said multiple stage refrigerator provides said cold head sleeve first stage region and second stage region at different temperatures;
said rope cables extending from said second stage to a thermal shield extend in both the radial and axial directions about the axis of said cold head sleeve;
the temperature of said first stage is different from the temperature of said second stage;
the at least one rope cable extending from said first stage is welded at the opposite end to a copper thermal contact strip on said stainless steel cold sleeve of said first stage;
the diameter of the second stage cold head sleeve is less than the diameter of first stage cold head sleeve; and
said contact strips extend axially along the first stage portion of said cold head sleeve.

10. The superconducting magnet heat transfer assembly of claim 9 wherein said flexible cables connected to said second stage extend generally radially from the sides of the second stage cold head sleeve and substantially axially from the end of said second stage cold head sleeve.

11. The superconducting magnet heat transfer assembly of claim 10 wherein said cryogenic refrigerator includes cylinders moving along its axial length.

12. The superconducting magnet heat transfer assembly of claim 3 wherein said rope-lay cable includes 1,666 copper wires in a 7×7×34/36 rope braid configuration.

13. The superconducting magnet heat transfer assembly of claim 12 wherein the length of said rope-lay cable is approximately 7 inches.

14. The superconducting magnet heat transfer assembly of claim 13 wherein said rope-lay cable has a bend radius of approximately 1 inch when connected between said cold head sleeve and said at least one thermal member.

* * * * *